United States Patent [19]

Hsu et al.

[11] Patent Number: 5,384,277
[45] Date of Patent: Jan. 24, 1995

[54] METHOD FOR FORMING A DRAM TRENCH CELL CAPACITOR HAVING A STRAP CONNECTION

[75] Inventors: Louis L. Hsu; Toshio Mii, both of Fishkill; Joseph F. Shepard; Seiki Ogura, both of Hopewell Junction, all of N.Y.

[73] Assignee: International Business Machines Corporation, Armonk, N.Y.

[21] Appl. No.: 169,875

[22] Filed: Dec. 17, 1993

[51] Int. Cl.[6] .................... H01L 21/70; H01L 27/00
[52] U.S. Cl. ........................ 437/52; 437/60; 437/919
[58] Field of Search ................ 437/47, 52, 60, 919

[56] References Cited

U.S. PATENT DOCUMENTS 4,688,063  8/1987  Lu et al. ............... 257/301
4,873,205 10/1989  Critchlow et al. ....... 437/200
4,983,544  1/1991  Lu et al. .............. 437/919
5,272,102 12/1993  Hur et al. .............. 437/52

*Primary Examiner*—Olik Chaudhuri
*Assistant Examiner*—H. Jey Tsai

[57] ABSTRACT

A method of forming a MOS DRAM cell having a trench capacitor in which the strap connection to the trench capacitor, the source, drain, and isolation are all raised above the surface of the single crystal silicon includes the steps of forming the trench capacitors, depositing a blanket gate stack including the gate oxide and a set of gate layers, and then depositing isolation members in apertures etched in the gate stack using the gate oxide as an etch stop. The same sidewalls that are used to form an LDD source and drain combine with nitride sidewalls on a gate contact aperture to separate a gate contact from source and drain contacts.

14 Claims, 2 Drawing Sheets

METHOD FOR FORMING A DRAM TRENCH CELL CAPACITOR HAVING A STRAP CONNECTION

TECHNICAL FIELD

The field of the invention is that of CMOS integrated circuit processing.

BACKGROUND ART

In the field of integrated circuit processing, it is essential to isolate one transistor from a neighboring transistor or other component. The art currently uses a trench isolation in which a trench is etched into the electrically active silicon and filled with oxide, or LOCOS isolation in which thermal oxide ($SiO_2$), is grown downwardly into the silicon. Variations on these schemes are well known in the art, all commonly having the factor that there is an insulator, usually oxide, of a thickness sufficient to prevent voltage on an interconnection line above the insulator from inverting the silicon beneath the insulator and thereby creating a parasitic channel; and that all or part of the isolation is recessed to provide for smaller step height for the interconnection. Throughout the years, the art has tended to smooth topographical features in the isolation while maintaining protection against parasitic channel formation.

Before the introduction of LOCOS, when design rules were above 5 $\mu$m, a blanket oxide was grown over the wafer before any of the elements of the transistors were fabricated. Apertures were etched into the blanket insulation to hold the transistors. In this case, topographical features were severe, which caused significant reduction in yield as design ground rules became smaller and the step to be traversed by interconnects became sharper. One distinguishing feature of this old prior art work compared with more recent prior art work was that there was a direct line between adjacent transistors along the surface of the single crystal silicon. Since the minimum distance between transistors was on the order of 5$\mu$m, there was considerable resistance on this path that is not present in modern submicron technology.

A number of problems have also become apparent in the case of trench isolations, which are preferred to the old blanket approach because of their planar surfaces and because of the elimination of the "bird's beak" associated with LOCOS isolations, thereby permitting a shorter, smaller transverse dimension than LOCOS isolations. The approaches in the art have attempted to reduce step size by recessing the insulator into the single crystal area, with the result there that was an increased risk of creating defects in the single crystal material in the process of forming the isolation. The art has long sought a method of isolation in which the smallest transverse distance can be obtained without compromising the effectiveness of the isolation.

SUMMARY OF THE INVENTION

A method of forming a MOS DRAM with an equal or less than 0.35$\mu$m ground rule cell having a trench capacitor in which the strap connection to the trench capacitor, the source, drain, and isolation are all raised above the surface of the single crystal silicon and includes the steps of forming the trench capacitors, depositing a blanket gate stack including the gate oxide and a set of gate layers, cutting through the gate stack to form isolation apertures that are filled with oxide, and depositing source and drain connections in apertures etched in the gate stack using the gate oxide as an etch stop. Sidewalls in the source and drain apertures provide the LDD source and drain. A layer of dielectric is deposited and/or grown over the source and drain contacts. A self-aligned gate contact is formed by selectively removing through the dielectric and nitride on the gate stack or an aligned contact is formed, leaving nitride sidewalls to isolate the gate contact from the source and drain connections.

BEST MODE OF CARRYING OUT THE INVENTION

Figure 1:
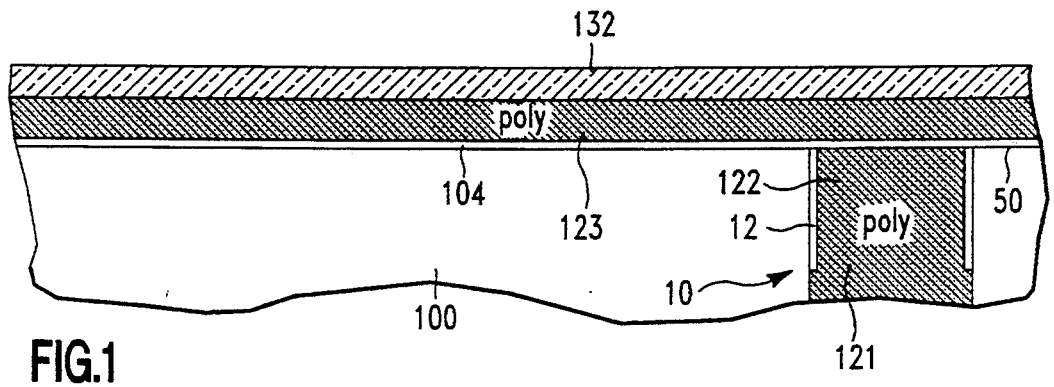
FIGS. 1 through 6 show in cross-section a portion of a DRAM cell.

Referring now to FIG. 1, there is shown in cross-section a portion of a silicon integrated circuit formed in single crystal substrate 100 having a surface 50. The example is a simplified DRAM cell. The epitaxial layer 100 of the single crystal silicon has been previously prepared by forming N-wells and/or P-wells and with the use of blanket threshold implants as is conventional in the art. These preliminary steps will be referred to as preparing the epitaxial layer. Trench capacitor 10 is constructed in a conventional fashion as illustrated in U.S. Pat. 5,065,273 or other equivalent methods. It uses two layers of conductive polysilicon (poly) as the central capacitor electrode which is insulated from epitaxial layer 10. The lower poly layer 121 has been recessed by an etch so that an oxide insulating collar 12 can be formed at the top portion of the trench. A second layer of polysilicon 122 is formed above layer 121. The surface has been planarized in a conventional chemical-mechanical process and a set of three layers has been formed across the wafer. The set of layers is referred to as the gate stack, and denoted by the numerals 104, 123 and 132, in which 104 is the gate oxide ($\leq 100$ Å $SiO_2$, formed by conventional dry thermal oxidation) of the final transistor gates that will be used, layer 123 is a layer of about 150–200 nm of polycrystalline silicon (poly) doped N+, and layer 132 is a layer of about 100 nm of nitride ($Si_3N_4$) that protects layer 123. Poly layer 123 and subsequent poly layers are doped by ion implantation after being put down. These implants are not heated in a diffusion step until after a poly gate contact has been made and both the bit line and the word line are in place. An intervening layer 124, shown as a thick line, is a layer of oxide of 50–100 Å formed for use as an etch stop when the nitride is removed.

Figure 2:
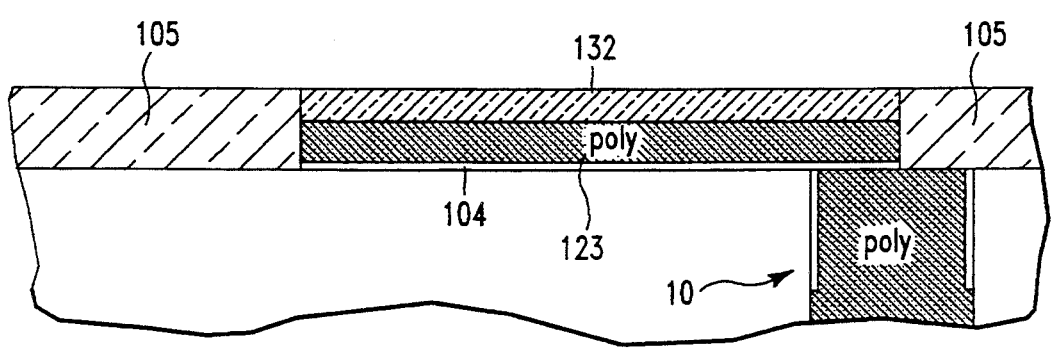

Referring now to FIG. 2, there are shown two isolation members of oxide 105 which have been deposited in a conventional low pressure CVD oxide process, e.g. TEOS. A conventional etching process such as reactive ion etching (RIE) was used to cut apertures for isolation members 105 down through nitride 132 and poly 123, stopping on oxide 104. After the etching step, a field implant may be performed in the apertures if it is desired to have better resistance to inversion. A typical field implant for a P− doped substrate might be about $5 \times 10^{17}/cm^3$ (boron). If oxide 104 is removed during the process of opening the apertures, a thin oxide layer may be grown to provide a stable surface under oxide 105. This layer will be comparable in thickness to the gate oxide, so that the isolation oxide does not penetrate below the gate oxide as it did in the prior art. After deposition, oxide isolation members 105 have been chemical-mechanically polished in a conventional fashion as illustrated in U.S. Pat. No. 5,015,594, so that there is a planar surface, referred to as the isolation surface, in which the oxide 105 is coplanar with the top of nitride 132. Isolation 105 extends in front of and behind the plane of the cross section to isolate the cell. It is evident in this figure that this method of isolation provides a planar reference at the top of the gate area (in the center of the drawing), so that contacts from the gate or the source or drain may extend smoothly over the isolation without any steps. The portion of the gate stack that remains covers the entire active device area of the DRAM cell which will contain a gate electrode, a bit line diffusion, and a diffused surface strap connection to the deep trench capacitor.

Those skilled in the art will appreciate that there must be a conductive contact (conventionally referred to as a strap) between poly 122 and the transistor drain to be formed in the single crystal material. If the strap makes contact with the gate or if the gate makes contact with the drain, the cell will not work. It is an advantageous feature of the present invention that the strap is self-aligned and protected from the gate (as will be shown below). Considerable tolerance is therefore permitted in the placement of the apertures that will hold contacts to the source and drain. In the embodiment illustrated, the nominal gate width is $\leq 0.35 \mu m$, the nominal width of the source is $\leq 0.25 \mu m$, and the nominal width of the strap aperture over the drain and trench is $\leq 0.25 \mu m$. So long as $0.2 \mu m$ of the drain is exposed for contact with the strap, the cell operation will be satisfactory, so that the placement tolerance on this aperture is $\pm 0.1 \mu m$.

Figure 3:
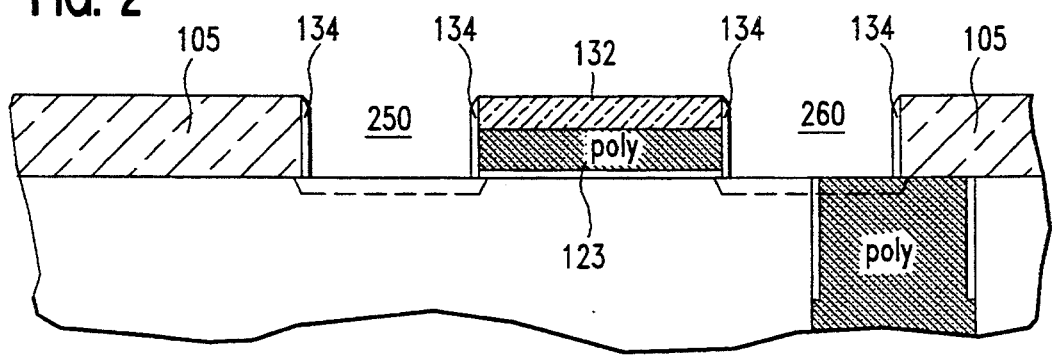

Referring now to FIG. 3, there is shown the next step after cutting source and drain apertures 250 and 260 through the gate stack using the same RIE process as used to cut apertures for oxide 105, after which oxide 104 at the bottom of the apertures has been stripped by a selective oxide etch, e.g. buffered HF solution (BHF). At this time, a light implant, the first dose of an LDD (Lightly Doped Drain) may be performed. A typical implant is $\sim 5 \times 10^{14}/cm^2$ of arsenic or phosphorous for an N-channel device.

After the light implant, a set of conformal sidewalls denoted collectively with the numerals 134 has been formed on the sides of all the apertures. These sidewalls are illustratively, a first layer ($\approx 100 \text{Å}$) of thermal oxide followed by a layer ($\approx 400 \text{Å}$) of nitride or CVD oxide. Sidewalls 134 isolate the gate stack from the strap connection that will be formed and also serves as the implant mask for the second source/drain implant.

Figure 4:
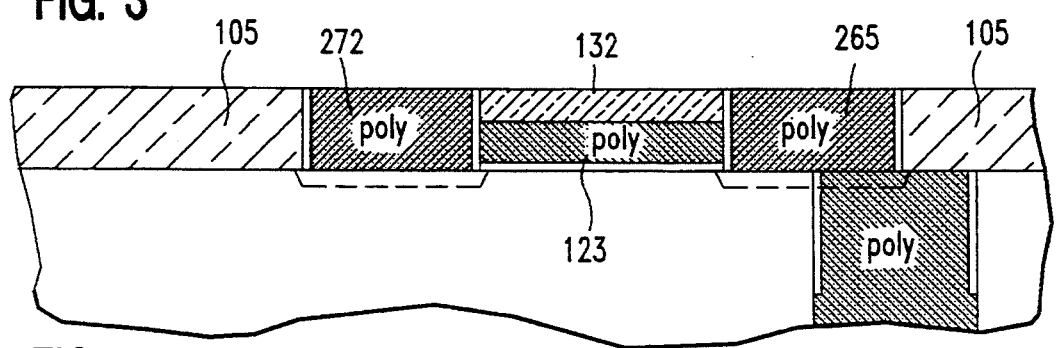

Referring now to FIG. 4, there is shown the results of a heavier source/drain implant, for example $3-5 \times 10^{15}/cm^2$ of As at 50–80 KeV in which sidewalls 134 protect the LDD portion of the transistor from the heavier dose so that the more heavily doped areas forming the sources and drains have been formed without affecting the previous light dose. A layer of polysilicon (doped in-situ) has been deposited in the apertures and polished back using nitride layer 132 as a polish stop. The portion of this poly layer in the former aperture 250 is a contact from source 252 that will be connected to a bit line in a later step as a connector 272. The portion of the layer on the right side is the connecting strap 265 that makes contact between drain 263 and the center electrode 122 of capacitor 10. The high degree of planarity is evident, as the poly contact 272 is coplanar with oxide 105.

Figure 5:
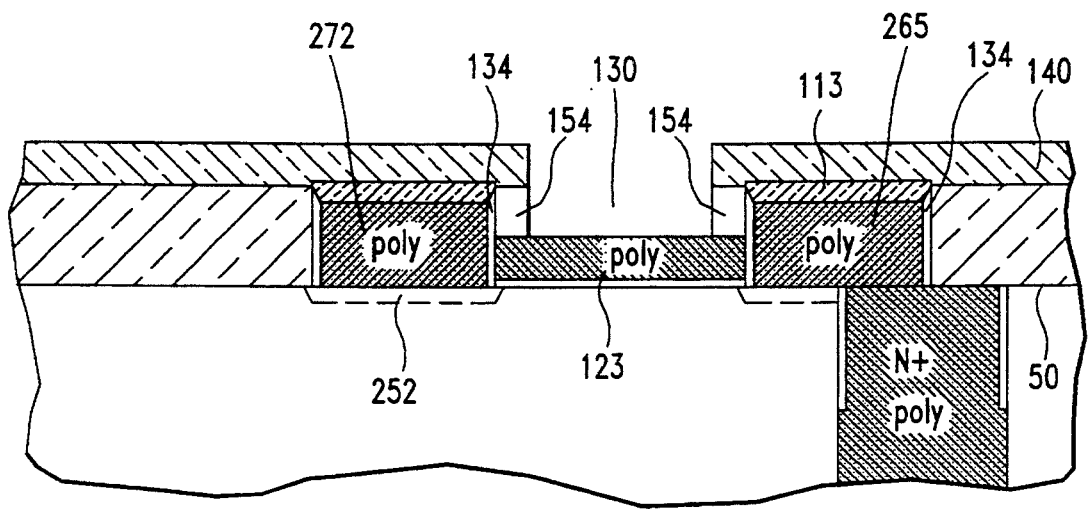

In FIG. 5, an optional insulating layer (oxide) 140 has been deposited and aperture 130 has been etched through the oxide and nitride 132 to expose gate 123 and provide for a gate contact. A typical etching process is $CF_4$—$H_2$ through the oxide and nitride, stopping on layer 124, which is then removed with BHF. Aperture 130 is made smaller than the width of gate 123, so that the subsequent word line conductor can overlap the contact and be the same width as the gate (below the contact). The DRAM cell size in this process is slightly greater than corresponding cells in self-aligned processes, such as that illustrated in U.S. Pat. No. 5,369,049 by an alignment tolerance, but the present process is much simpler, resulting in higher yield and lower cost. The nominal width of aperture 130 is $0.25 \mu m$ and the sidewalls 154 have a nominal width of $0.05 \mu m$ each for a nominal gate width of $0.35 \mu m$.

Figure 6:
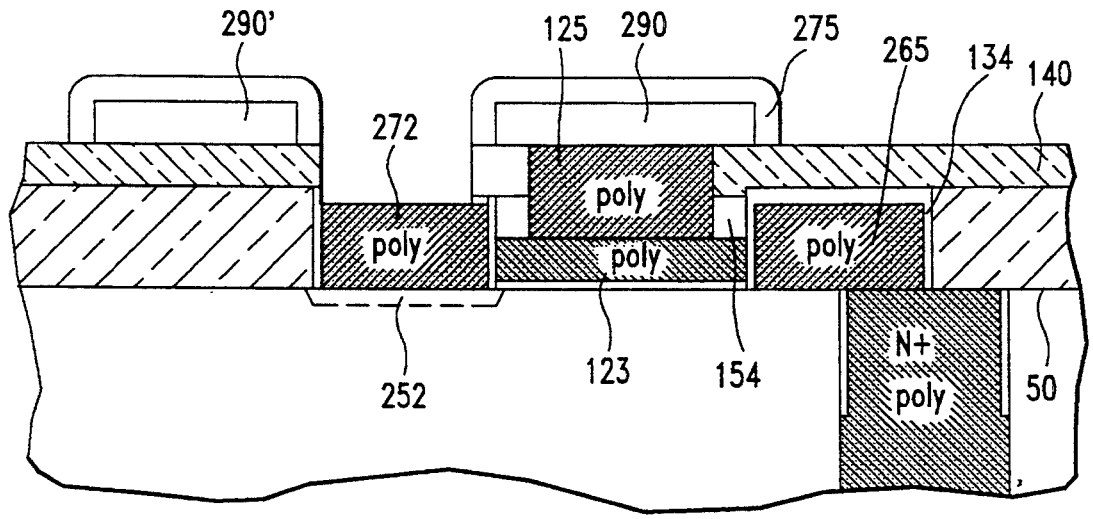

A final cross-section in FIG. 6 indicates that aperture 130 has been filled with a gate contact layer of poly that has been polished back to form gate contact 125 and that a layer of tungsten, protected by an insulator such as phosphorus silicon glass (PSG) 275 has been deposited to form word line 290. The word lines, which are connected to the gates of the transistors, extend perpendicular to the plane of the paper. On the left, a line 290' connects with cells out of the plane of the paper. Additional layers will be formed on top of layer 290 to establish the bit lines connected to contact 272 and other interconnections (the "back end" processes), as is conventional. The cell illustrated is one sided for simplicity in illustrating the principles of the invention, and those skilled in the art will readily be able to adapt the embodiment shown to different layouts, such as a symmetric pair of cells that share source 252. Those skilled in the art will readily appreciate that the process illustrated here can readily be applied in many circuits other than DRAMS.

An advantageous feature of the invention is that isolation 105 is formed above the surface of the silicon, surface 50. Referring for convenience to FIG. 6, it can be seen that there is a straight path along a surface 50 between the single crystal substrate and the bottom of oxide 105 between the trench on one capacitor and a corresponding trench 10' on another cell extending out of the drawing to the right. In the prior art of submicron critical dimension, a straight line on the surface was not tolerated and a shallow trench was typically cut to provide an insulator thickness great enough to prevent a channel from being induced by voltage applied to conductive lines passing above. Also, when the trench was cut down below the surface, any conductive path due to the finite conductivity of the material had to travel an irregular line of greater length. In LOCOS isolation, the thermal isolation oxide also grows down into the single-crystal substrate. In operation, one capacitor may be charged up to the nominal voltage of the device (5 volts or so) while the other is at ground providing a potential path through the short distance between them. In the case of the example illustrated, the groundrule is a nominal 0.25 micron, so that the potential for leakage is evident.

Additionally, the use of poly layers in the gate stack that are implanted after deposition and the deferring of heat treatment to diffuse the implants and activate the source and drain until just before the word line is deposited avoids a problem in the prior art in which heat treatment of doped poly increased the grain size which, in turn, permitted subsequent oxide etch steps to penetrate along grain boundaries and damage underlying layers. In this process, the poly is not exposed to an oxide etch after the heat treatment, so the possibility of penetration does not arise.

We claim:

1. A method of forming a set of memory cells for a MOS DRAM in a set of cell areas of a silicon substrate, each memory cell having an access transistor formed on an epi top surface of a single crystal epitaxial silicon layer and connected between an input/output contact and a trench storage capacitor, comprising the steps of:

preparing said epi layer;

forming a set of said trench storage capacitors in said epi having a conductive center electrode insulated from said epi, said center electrode having a conductive trench top surface;

forming a gate stack set of layers comprising a gate oxide layer on said epi top surface, at least one gate poly layer above said gate oxide layer and a gate nitride layer above said gate poly layer;

forming a set of isolation apertures isolating said cell areas by etching said gate nitride and said gate poly layers down to said gate oxide layer in a set of isolation areas covering an isolation portion of said trench top surface and extending between adjacent cell areas, whereby said trench top surface has a strap portion outside said isolation aperture and within said cell area;

depositing isolation oxide in said isolation apertures and polishing said isolation oxide using said gate nitride as a polish stop down to an isolation surface defined by said gate nitride;

patterning and etching down to said gate oxide layer a set of source-drain apertures covering source and drain portions of said cell, said set of source-drain apertures including a strap aperture subset of said set of source-drain apertures exposing said strap portions of said trench top surfaces, said strap aperture subset being aligned with said isolation regions and individual pairs of said set of source-drain apertures being separated by a transistor gate portion of said gate stack;

implanting an LDD dose of ions within said set of source-drain apertures;

forming LDD sidewalls within said set of source-drain apertures;

implanting sources and drains within said set of source-drain apertures, thereby defining a self-aligned access transistor comprising a source, a drain and a transistor gate portion lying between said source and drain;

depositing a source/drain conductor material within said set of source-drain apertures, thereby forming a surface strap connection between said trench capacitor and said access transistor and a source contact above said source;

polishing said source/drain conductor to said isolation surface using said isolation oxide as a polish stop; and opening a gate contact aperture in said gate nitride leaving a pair of nitride gate sidewalls separating said gate contact aperture from said LDD sidewalls.

2. A method according to claim 1, in which the step of forming the LDD sidewalls comprises the steps of depositing at least one conformal insulating layer on side walls of said source-drain apertures and removing said conformal layer from the bottom of said apertures, thereby forming a set of self-aligned strap apertures in which the strap location is insulated from said gate stack by said LDD sidewalls.

3. A method according to claim 2, further comprising the step of growing a thin thermal oxide in said isolation apertures before said step of depositing said isolation oxide.

4. A method according to claim 2, further comprising the step of oxidizing said source and drain contacts using said nitride layer as an oxidization mask.

5. A method according to claim 2, further comprising the step of polishing said gate poly layer using said isolation oxide as a polish stop, whereby said set of cells has a top surface at said isolation surface.

6. A method according to claim 4, further comprising the step of polishing said gate poly layer using said isolation oxide as a polish stop, whereby said set of cells has a top surface at said isolation surface.

7. A method according to claim 1, further comprising the step of annealing said substrate after formation of said source-drain contacts and opening of said gate contact aperture, whereby poly layers are not exposed to oxide etch steps after heat treatment.

8. A method according to claim 7, in which the step of forming the LDD sidewalls comprises the steps of depositing at least one conformal insulating layer on side walls of said source-drain apertures and removing said conformal layer from the bottom of said apertures, thereby forming a set of self-aligned strap apertures in which the strap location is insulated from said gate stack by said LDD sidewalls.

9. A method according to claim 8, further comprising the step of growing a thin thermal oxide in said isolation apertures before said step of depositing said isolation oxide.

10. A method according to claim 8, further comprising the step of oxidizing said source and drain contacts using said nitride layer as an oxidization mask.

11. A method according to claim 8, further comprising the step of polishing said gate poly layer using said isolation oxide as a polish stop, whereby said set of cells has a top surface at said isolation surface.

12. A method according to claim 10, further comprising the step of polishing said gate poly layer using said isolation oxide as a polish stop, whereby said set of cells has a top surface at said isolation surface.

13. A method according to claim 8, further comprising the step of selectively removing said nitride layer using said oxidized source and drain contacts as a self-aligned etch mask.

14. A method according to claim 11, further comprising the step of selectively removing said nitride layer using said oxidized source and drain contacts as a self-aligned etch mask.

* * * * *